US008968470B2

(12) United States Patent
Jang et al.

(10) Patent No.: US 8,968,470 B2
(45) Date of Patent: *Mar. 3, 2015

(54) GRAPHITE CRUCIBLE FOR SILICON ELECTROMAGNETIC INDUCTION HEATING AND APPARATUS FOR SILICON MELTING AND REFINING USING THE GRAPHITE CRUCIBLE

(75) Inventors: Bo Yun Jang, Daejeon-si (KR); Young Soo Ahn, Daejeon-si (KR); Joon Soo Kim, Seoul (KR); Sang Hyun Park, Daejeon-si (KR); Dong Kook Kim, Daejeon-si (KR); Gwon Jong Yu, Daejeon-si (KR)

(73) Assignee: Korea Institute of Energy Research, Daejeon-Si (KR)

( * ) Notice: Subject to any disclaimer, the term of this patent is extended or adjusted under 35 U.S.C. 154(b) by 1296 days.

This patent is subject to a terminal disclaimer.

(21) Appl. No.: 12/568,436

(22) Filed: Sep. 28, 2009

(65) Prior Publication Data

US 2010/0095883 A1 Apr. 22, 2010

(30) Foreign Application Priority Data

Oct. 16, 2008 (KR) .................. 10-2008-0101658

(51) Int. Cl.
*C30B 35/00* (2006.01)
*C30B 13/14* (2006.01)

(52) U.S. Cl.
CPC ..................... *C30B 13/14* (2013.01)
USPC ............ 117/200; 117/208; 117/217; 373/7; 373/138; 373/140; 373/144; 373/151; 373/152; 373/156; 65/441; 65/425; 219/635; 219/638; 219/647; 219/649

(58) Field of Classification Search
USPC ............ 373/7, 138, 140, 144, 151, 152, 156; 65/441, 425; 219/635, 638, 647, 649; 117/200, 208, 217
See application file for complete search history.

(56) References Cited

U.S. PATENT DOCUMENTS 3,067,139 A * 12/1962 Goorissen ................. 117/31
4,915,723 A * 4/1990 Kaneko et al. ............. 65/144

(Continued)

FOREIGN PATENT DOCUMENTS

JP 1264920 A 10/1989
JP 9-263480 10/1997

(Continued)

OTHER PUBLICATIONS

Supplementary European Search Report dated Nov. 25, 2014.

*Primary Examiner* — Matthew Song
(74) *Attorney, Agent, or Firm* — Lowe Hauptman & Ham, LLP

(57) ABSTRACT

Disclosed herein are a graphite crucible for electromagnetic induction-based silicon melting and an apparatus for silicon melting/refining using the same, which performs a melting operation by a combination of indirect melting and direct melting. The crucible is formed of a graphite material and includes a cylindrical body having an open upper part through which a silicon raw material is charged into the crucible, and an outer wall surrounded by an induction coil, wherein a plurality of slits are vertically formed through the outer wall and an inner wall of the crucible such that an electromagnetic force created by an electric current flowing in the induction coil acts toward an inner center of the crucible to prevent a silicon melt from contacting the inner wall of the crucible.

14 Claims, 8 Drawing Sheets

(56) References Cited

U.S. PATENT DOCUMENTS

| | | |
|---|---|---|
| 5,372,090 A | 12/1994 | Wegmeth et al. |
| 5,394,432 A * | 2/1995 | Fukuzawa et al. ............ 373/156 |
| 7,000,678 B1 | 2/2006 | Mon et al. |
| 7,258,744 B2 | 8/2007 | Sakurada et al. |
| 2006/0037733 A1* | 2/2006 | Mon et al. ..................... 164/503 |
| 2007/0039544 A1* | 2/2007 | Kaneko .......................... 117/81 |
| 2008/0179037 A1* | 7/2008 | Yoshihara et al. ............ 164/460 |

FOREIGN PATENT DOCUMENTS

| | | |
|---|---|---|
| JP | 2001-019594 | 1/2001 |
| JP | 2004125246 A | 4/2004 |
| JP | 2005-179080 | 7/2005 |
| JP | 2005179080 A | 7/2005 |
| JP | 2005-281085 | 10/2005 |
| KR | 10-2006-016659 A | 2/2006 |

* cited by examiner

US 8,968,470 B2

GRAPHITE CRUCIBLE FOR SILICON ELECTROMAGNETIC INDUCTION HEATING AND APPARATUS FOR SILICON MELTING AND REFINING USING THE GRAPHITE CRUCIBLE

CROSS-REFERENCE TO RELATED APPLICATIONS

This application claims priority under 35 USC Section 119 from Korean Patent Application No. 10-2008-0101658, filed Oct. 16, 2008, the entire disclosure of which is hereby incorporated by reference.

FIELD OF THE INVENTION

The present invention relates to a crucible for silicon melting and, more particularly, to a graphite crucible for electromagnetic induction-based silicon melting, which can melt semiconductors such as silicon with high efficiency by a combination of crucible-heat indirect melting and electromagnetic induction-based direct melting, and an apparatus for melting and refining silicon using the same.

BACKGROUND OF THE INVENTION

Electromagnetic induction-based direct melting can rapidly melt metallic materials, thereby ensuring high yield with minimized contamination of raw materials. Electromagnetic induction-based direct melting is generally performed according to the following principle.

When an alternating current is applied to an induction coil wound around a crucible to induce magnetic field variation, an induction current is created on the surface of metal to be melted thereby inducing Joule heating, which melts the metal. Further, the induction current interacts with a magnetic field to generate Lorentz force in the molten metal.

Since the Lorentz force is always directed toward an inner center of the crucible and provides a pinch effect or electromagnetic pressure effect according to the Fleming's left hand rule even when the direction of the current in the coil is varied, it is possible to prevent the molten metal from contacting an inner wall of the crucible.

However, the electromagnetic induction melting cannot be applied when melting semiconductors such as silicon. That is, since silicon has a very high melting point of 1,400° C. or more and a very low electric conductivity at 700° C. or less unlike metals, it is difficult to achieve direct electromagnetic induction-based silicon melting.

When melting semiconductors such as silicon, indirect melting with heat from a graphite crucible is generally used. Although graphite is a non-metallic material, it has very high electric and thermal conductivity, thereby allowing the crucible to be easily heated through electromagnetic induction.

As known in the art, however, since graphite in the crucible shields electromagnetic waves, an electromagnetic force cannot be delivered to the graphite crucible. Thus, currently, melting the semiconductors such as silicon in the graphite crucible is carried out only by indirect melting with heat from the crucible.

When indirect silicon melting is performed in the graphite crucible, silicon melt contacts the surface of the crucible. Then, the silicon melt reacts with graphite, thereby causing carbon contamination on silicon from the inner surface of the crucible. Furthermore, the reaction between the silicon melt and graphite generates a silicon carbide layer on the inner surface of the crucible, which often causes cleavage of the crucible.

To solve such problems, a technique for silicon carbide (SiC) coating or high density treatment on an inner surface of a graphite crucible which will contact silicon is proposed. FIG. 1 shows a cross-section of the graphite crucible, an inner surface of which is coated with SiC.

In FIG. 1, a silicon carbide coating 110 is formed on the inner surface of the graphite crucible and suppresses reaction between graphite and silicon melt. As a result, it is possible to prevent contamination of silicon or the crucible. Furthermore, the suppression of the reaction can prevent thickness growth of a composite layer 120, which has silicon carbide dispersed in a graphite matrix of the composite layer 120, into a graphite base 130, thereby preventing cleavage of the graphite crucible.

However, the SiC coating 110 tends to be exfoliated from the inner surface of the crucible while melting silicon in the crucible, thereby reducing lifespan of the crucible and insufficiently preventing contamination of silicon.

A cold copper crucible can be used to prevent contact between the silicon melt and the inner surface of the crucible during silicon melting. However, although it has a merit of preventing contact between the silicon melt and the crucible by electromagnetic induction, this crucible requires an assistant heat source for forming an initial silicon melt and generally undergoes severe heat loss due to cooling water.

To solve the problems of the cold copper crucible, a technique of using plasma as an assistant heat source is proposed. However, this technique complicates structure of a silicon melting apparatus and provides low efficiency due to heat loss of 30% or more through cold copper crucible.

To solve the problems of the graphite crucible and the cold copper crucible, a crucible which combines the structure of the cold copper crucible (cold crucible) and the graphite crucible (hot crucible) is proposed. The structure of this crucible is shown in FIG. 2.

In FIG. 2, the disclosed crucible includes a hot crucible 250 formed of a graphite material and disposed on top of a cold copper crucible 220. The hot crucible 250 has a circumferentially integral upper end and plural segments 240 are formed from a lower end of the hot crucible 250 to a lower end of the cold crucible 220 by a plurality of vertical slits 230. The hot crucible 250 is insulated by an insulator 260 to improve silicon heating efficiency and to protect an induction coil 210.

In the crucible of this configuration, after forming an initial silicon melt using the hot graphite crucible 250, a raw material of the initial silicon melt is further heated and melted, with electromagnetic pressure longitudinally exerted to the overall silicon melt and maintained above the hydrostatic pressure of the silicon melt, thereby improving heating and melting efficiency.

Since the disclosed crucible is formed by combining the cold crucible and the hot crucible, it is more difficult to fabricate such a combination type crucible than an integral type crucible such as the graphite crucible and the like. Moreover, as shown in FIG. 2, since the upper hot crucible formed of the graphite material serves only as the assistant heat source and silicon melting is performed substantially by the cold crucible, the crucible inevitably undergoes heat loss due to water cooling.

SUMMARY OF THE INVENTION

An aspect of the present invention is to provide a highly efficient graphite crucible for electromagnetic induction-based silicon melting and an apparatus for melting and refining silicon using the same, which can solve problems caused by contact between a silicon melt and graphite in a typical graphite crucible and can solve a problem of heat loss caused by water cooling in a typical cold copper crucible.

In accordance with an aspect of the present invention, a graphite crucible for electromagnetic induction-based silicon melting is formed of a graphite material and includes a cylindrical body having an open upper part, through which a silicon raw material is charged into the crucible, and an outer wall surrounded by an induction coil, wherein a plurality of vertical slits are formed through the outer wall and an inner wall of the crucible such that an electromagnetic force created by an electric current flowing in the induction coil acts toward an inner center of the crucible to prevent a silicon melt from contacting the inner wall of the crucible.

In accordance with another aspect of the present invention, an apparatus for melting and refining silicon with the graphite crucible for electromagnetic induction-based silicon melting includes a cylindrical crucible formed of a graphite material, the crucible having an open upper part and a plurality of vertical slits formed through inner and outer walls of the crucible, and an induction coil surrounding the outer wall of the crucible, wherein a silicon raw material charged into the crucible through the upper part of the crucible is indirectly melted to form a silicon melt by the crucible undergoing induction heating, and the silicon melt undergoes induction melting while being prevented from contacting the inner wall of the crucible by an electromagnetic force created by an electric current flowing in the induction coil and acting toward an inner center of the crucible.

According to an embodiment of the invention, the graphite crucible can be fabricated at low cost and solve problems of contact between a silicon melt and graphite and heat loss by a combination of indirect melting and contact-free electromagnetic induction-based direct melting, thereby achieving highly efficient electromagnetic induction-based silicon melting and high purity refining by agitation of the silicon melt.

DETAILED DESCRIPTION OF THE INVENTION

Embodiments of the present invention will now be described with reference to the accompanying drawings.

Figure 1:
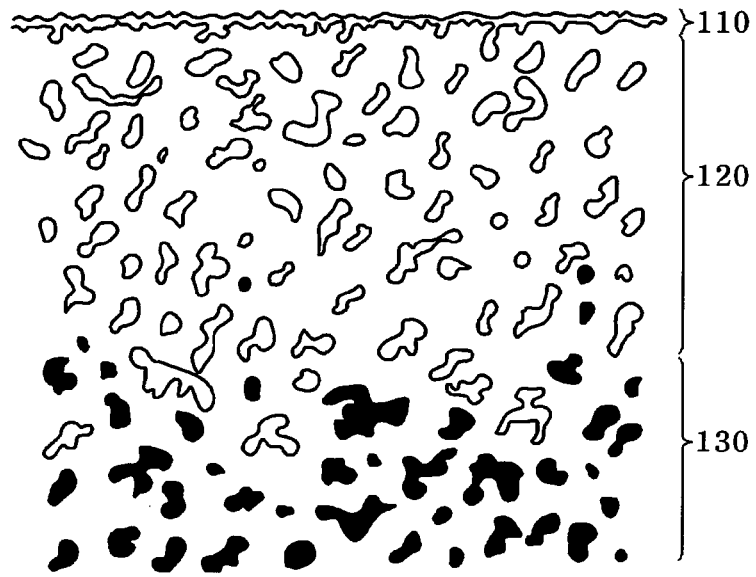
FIG. 1 shows a cross-section of a conventional graphite crucible coated with silicon carbide.
Figure 2:
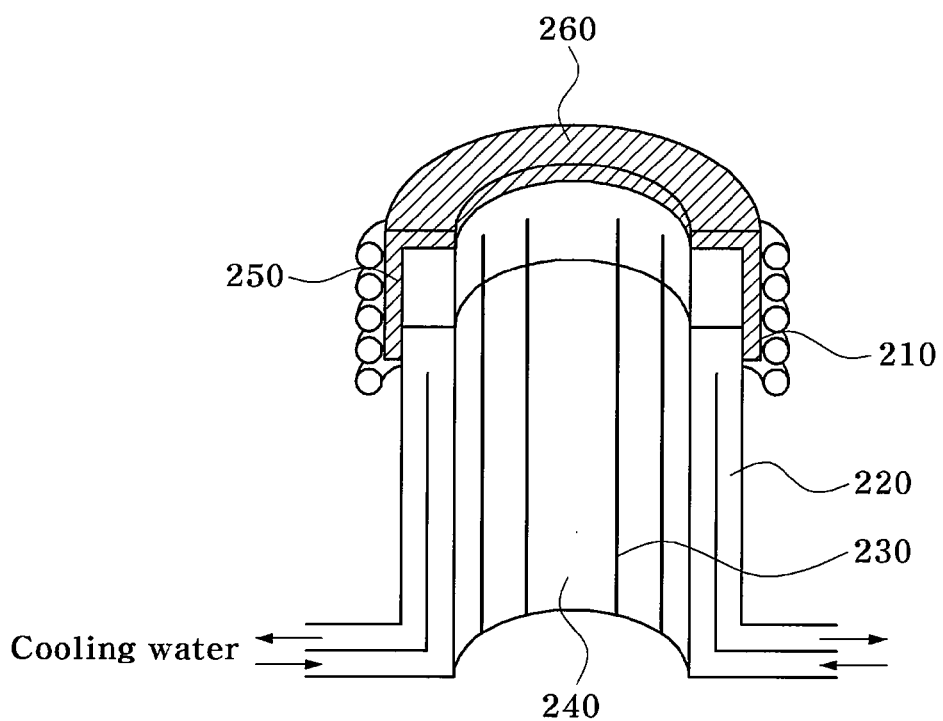
FIG. 2 is a sectional view of a conventional crucible which includes an upper hot crucible disposed on top of a cold crucible.
Figure 3:
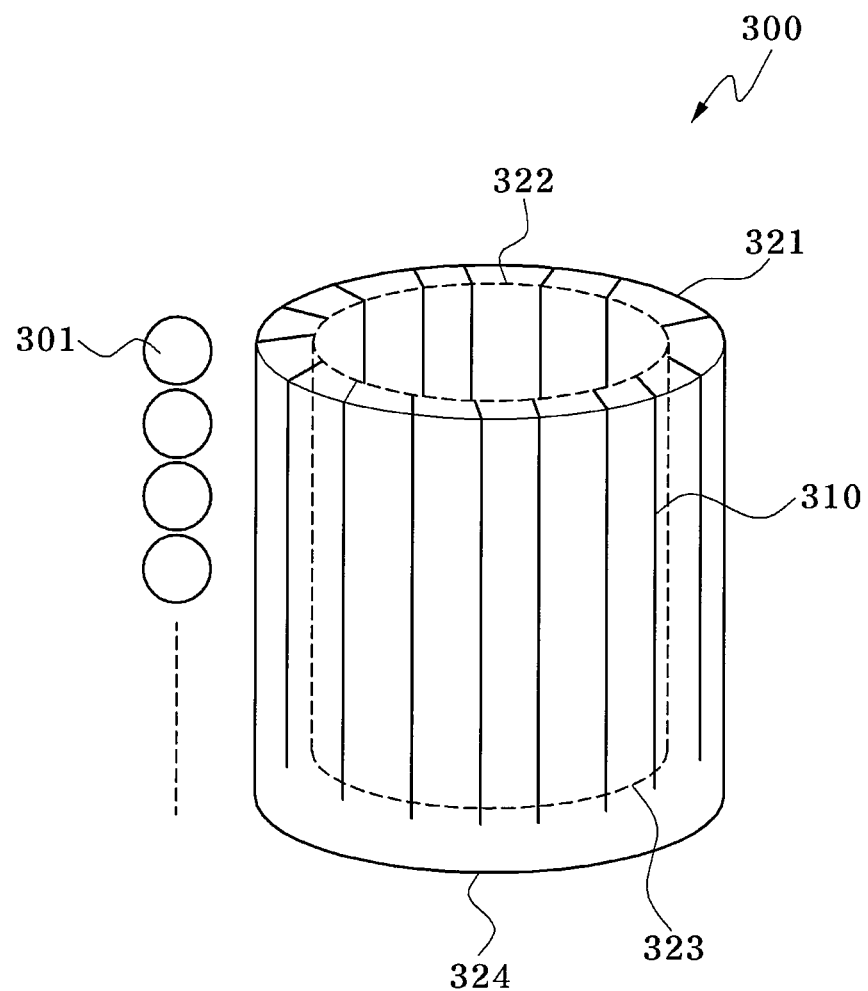
FIG. 3 is a view of a graphite crucible for electromagnetic induction-based silicon melting according to an embodiment of the present invention.
Figure 4:
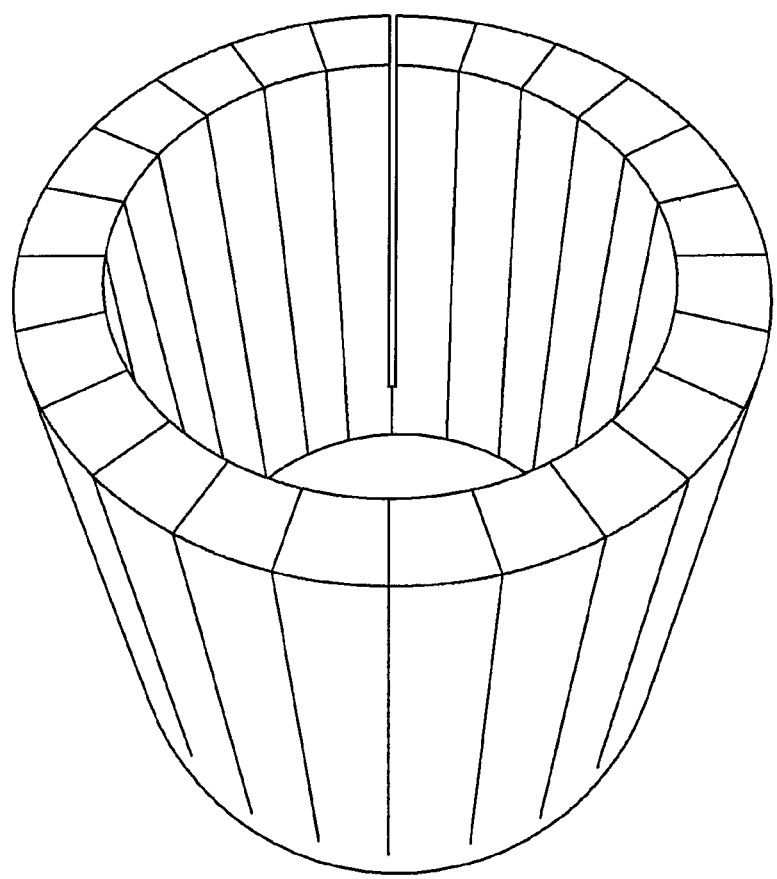
FIG. 4 is a picture of the graphite crucible shown in FIG. 3.

FIG. 3 is a view of a graphite crucible for electromagnetic induction-based silicon melting according to an embodiment of the present invention. FIG. 4 is a picture of the graphite crucible shown in FIG. 3. FIG. 4 will also be referred to in description of the graphite crucible of FIG. 3.

In FIG. 3, the graphite crucible 300 according to the embodiment includes a cylindrical body which has an open upper part. An outer wall 321 of the crucible is surrounded by an induction coil 301 during a process of melting silicon. A silicon raw material is charged into the crucible through the upper part of the crucible.

As shown in FIG. 4, the graphite crucible 300 has a plurality of slits 310 vertically formed through an inner wall 322 and the outer wall 321 of the crucible. In typical silicon melting graphite crucibles which have no slit, an electromagnetic force does not substantially act within the crucible because electromagnetic waves are shielded by graphite.

On the contrary, in the crucible having the plural slits 310 penetrating the inner and outer walls 322 and 321 of the crucible as shown in FIG. 3, the electromagnetic waves are not shielded by graphite so that the electromagnetic force can be intensively exerted into the crucible, as can be seen from test results described below.

Figure 5:
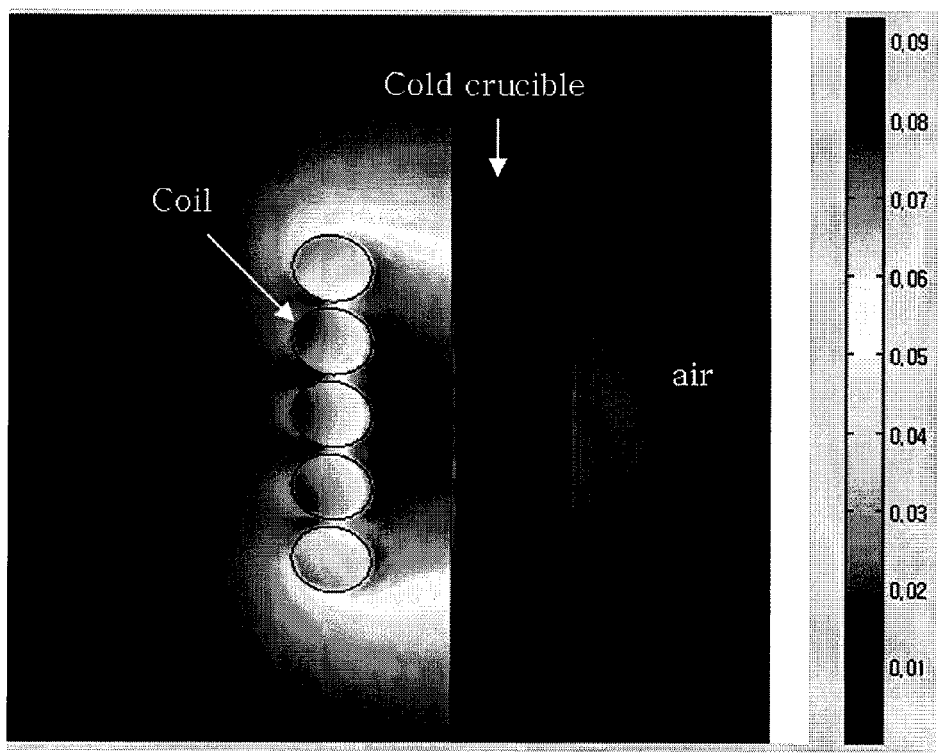
FIGS. 5 and 6 are results of numerical analysis on interior magnetic field density of a conventional cold copper crucible and a graphite crucible according to an example of the present invention, respectively.
Figure 6:
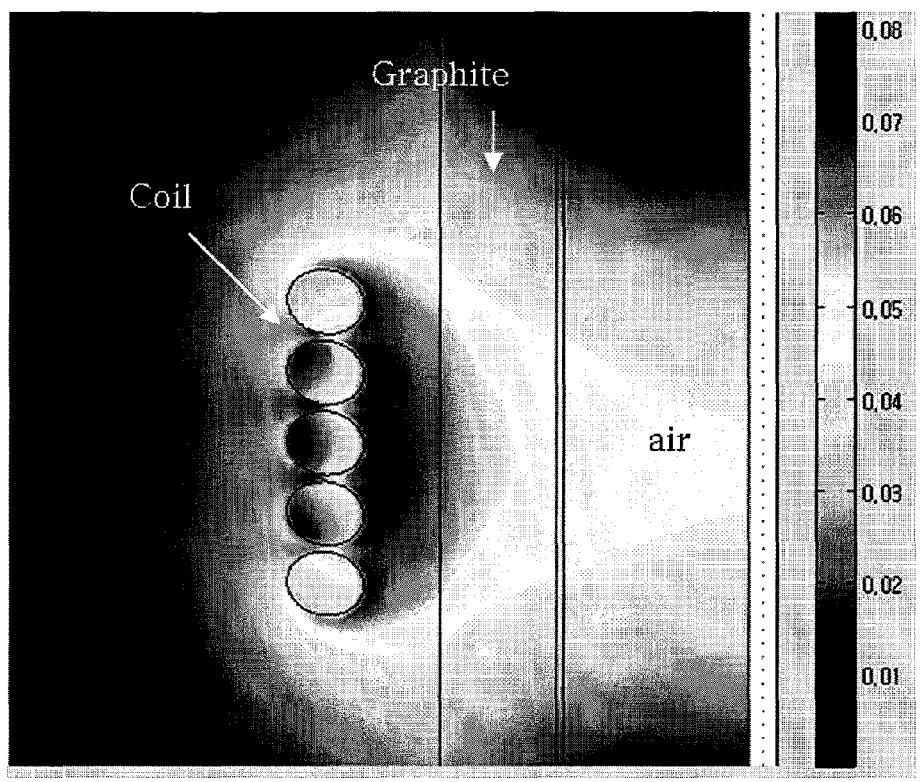

FIGS. 5 and 6 show results of numerical analysis on interior magnetic field density of a conventional cold copper crucible and a graphite crucible according to an example of the present invention, respectively. It can be seen from FIGS. 5 and 6 that the graphite crucible having plural slits (FIG. 6) has a higher interior magnetic field density than the conventional cold copper crucible (FIG. 5). This means that the plural slits formed in the graphite crucible enable the electromagnetic force to be further intensively exerted toward the inner center of the crucible.

Therefore, the electromagnetic force created by an electric current flowing in the induction coil 301 acts toward the inner center of the crucible and prevents silicon melt from contacting the inner wall 322 of the crucible.

Even when the electromagnetic force is exerted toward the inner center of the crucible, if the electromagnetic force is less than a hydrostatic pressure caused by gravity, the silicon melt will spread. Thus, the electromagnetic force must be higher than the hydrostatic pressure in the direction of the inner center of the crucible.

Figure 7:
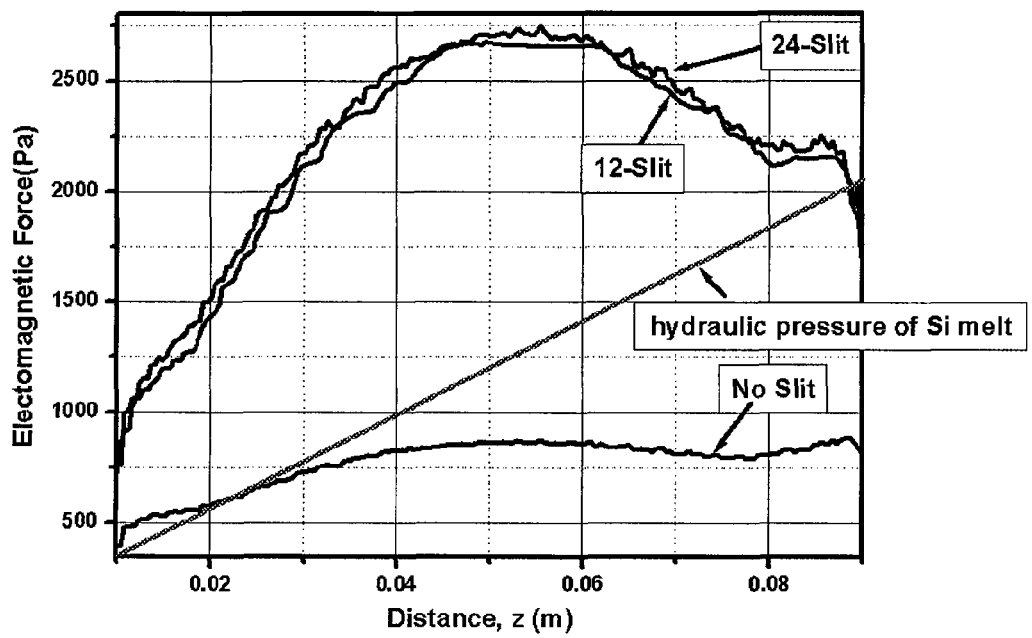
FIG. 7 is a graph depicting hydrostatic pressure and electromagnetic pressure acting on a silicon melt in the vertical direction within the graphite crucible according to the embodiment of the present invention.

FIG. 7 is a graph depicting hydrostatic pressure and electromagnetic pressure acting on a silicon melt in the vertical direction within the graphite crucible according to the embodiment of the present invention.

It can be seen from FIG. 7 that the electromagnetic pressure acting on a silicon melt is lower than the hydrostatic pressure when the graphite crucible has no slit. In this case, it is substantially impossible to achieve contact-free silicon melting.

On the other hand, in the graphite crucible formed with 12 or 24 slits 310, the electromagnetic pressure acting toward the inner center of the crucible is higher than the hydrostatic pressure which makes the silicon melt spread.

The plurality of slits 310 may be vertically formed from the upper part of the crucible to a lower surface 324 thereof. Alternatively, since an inner bottom surface 323 and the lower surface 324 of the crucible also are filled with graphite, the plurality of slits 310 may be formed from the upper part of the crucible to the inner bottom surface 323 of the crucible.

In order to allow the electromagnetic force to prevent a silicon melt from contacting the inner wall 322 of the crucible, there is a need to allow the electromagnetic force to act toward the inner center of the crucible. For this purpose, the plural slits 310 may be uniformly arranged and separated at constant intervals from each other such that segments divided by the slits 310 may have the same size.

Further, in order to allow the electromagnetic force to act toward the inner center of the crucible, the plurality of vertical slits 310 may be radially (that is, in the direction of the center) formed in the crucible.

In the cylindrical crucible structure, the electromagnetic force may act toward the inner center of the cylindrical crucible when two or more vertical slits are formed in the crucible. Thus, the number of plural slits 310 can be arbitrarily determined. However, if an excessively small number of slits is formed in the crucible, the electromagnetic force cannot sufficiently act toward the inner center of the crucible, thereby allowing the silicon melt to contact the inner wall 322. On the other hand, if an excessively large number of slits are formed in the crucible, indirect silicon melting can be retarded due to heat from the graphite crucible, irrespective of sufficient action of the electromagnetic force toward the inner center of the crucible. Thus, the number of vertical slits 310 may be determined in consideration of both indirect silicon melting and non-contact with graphite, and the plural slits may be symmetrically arranged in the radial direction.

For efficient electromagnetic induction melting, the crucible may be formed with at least 12 slits 310, and the number of slits may be increased along with an increase of an inner diameter of the crucible. Here, when the crucible has an inner diameter of 50 mm or more, the crucible may be formed with at least 24 slits.

Although the width of each vertical slit 310 can also be arbitrarily determined, the width of each slit 310 may be determined in the range of 0.1~3 mm in consideration of intensity of the electromagnetic force acting within the crucible and an indirect heating degree obtained by the slits.

Next, the present invention will be described in more detail with reference to inventive and comparative examples.

Numerical analysis and an electromagnetic induction melting test were performed using graphite crucibles having slits, as shown in FIGS. 3 and 4, and a typical crucible having no slit. In the test, electromagnetic forces acting toward the center of silicon melt were calculated while monitoring a contact state of the silicon melt.

Examples 1 and 2

Graphite crucibles each having a height of 90 mm, an inner diameter of 60 mm and an outer diameter of 80 mm were prepared. Here, one graphite crucible had 12 slits (Example 1) and the other had 24 slits (Example 2), each of which had a slit width of 1 mm and was formed to the bottom of the crucible. Each of the graphite crucibles had a graphite density of 1.75 or more. A cold induction coil having a diameter of 8 mm was turned 8 times around each graphite crucible to have an inner diameter of 100 mm, an outer diameter of 1200 mm, and a separation of 1~2 mm between turns of the induction coil. Alternating power having a frequency of 6~10 kHz was applied up to 20 kW to the coil.

After filling the crucible with a silicon chunk having a purity of 99.5% and a size of 1~10 mm, a base pressure of $10^{-3}$~$10^{-5}$ Torr was created in the crucible, which in turn was filled with Ar. Then, a test was performed by gradually increasing the alternating power at a working pressure of several Torr. In the test, melting behavior was observed while measuring a slit temperature, a bottom temperature and a silicon temperature in each crucible.

Test Results

For Example 1 having 12 slits, the melting test was performed after filling the graphite crucible with the silicon chunk. As the alternating power was increased, the temperature near the bottom of the crucible was increased at first and there was a temperature difference of about 100° C. between the upper side of the slits and the bottom. When a power of 15 kW or more was supplied, the silicon chunk started melting and the melted silicon was agitated upwardly.

Although a contact-free state between the inner wall of the crucible and the silicon could not be confirmed with the naked eye, there was no flow of the silicon melt through the slits. Further, cooled silicon and the inner wall of the graphite crucible showed that there was no reaction between the silicon melt and graphite.

For Example 2 having 24 slits symmetrically arranged thereon, the same test was performed. As in Example 1, it was found that the temperature near the bottom of the crucible was increased at first and there was a temperature difference of up to 300° C. between the upper side of the slits and the bottom.

Figure 8:
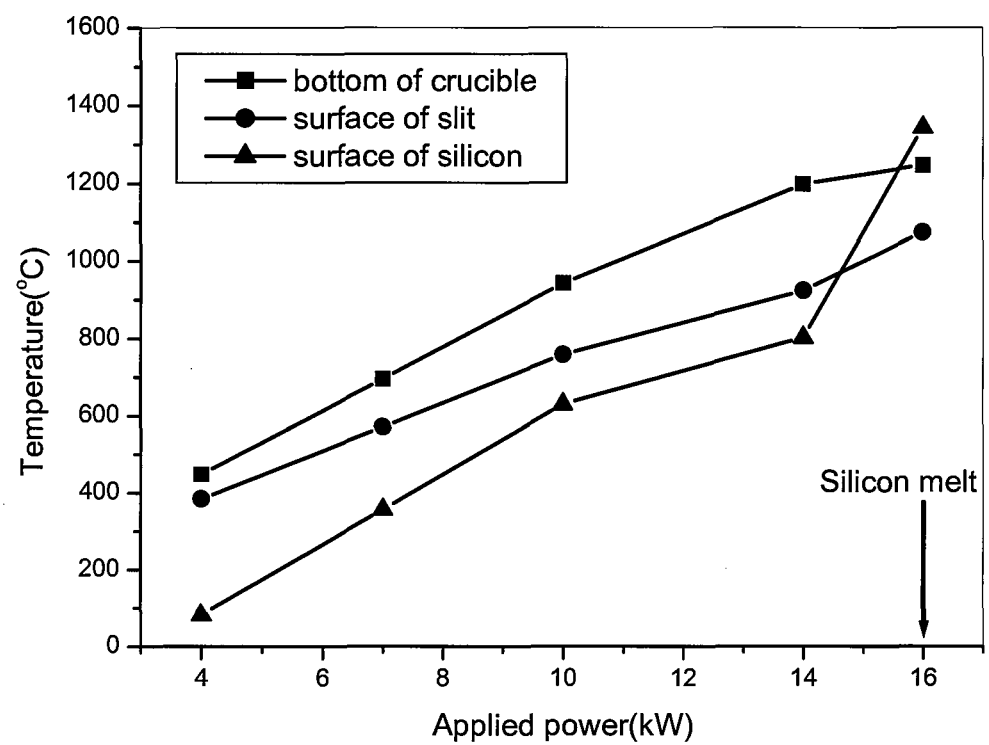
FIG. 8 is a graph depicting temperature of a crucible bottom, an upper side of a slit, and an upper surface of silicon when melting silicon using the graphite crucible according to the embodiment of the present invention.

FIG. 8 is a graph depicting temperatures of the crucible bottom, the upper side of the slits, and the upper surface of silicon according to power applied to the induction coil in the examples. When a power of 15 kW or less was applied to the coil, the upper side temperature of the slits was not increased as much as the bottom temperature.

However, when a power of 15 kW or more was applied, the temperature of the silicon was rapidly increased. In other words, silicon started melting near 15 kW and the silicon melt was then moved upward in the crucible by an electromagnetic force which deeply invaded the silicon melt. Then, a silicon melt forming rate was rapidly increased, thereby allowing indirect melting to start. When a power of 16 kW was applied, the silicon chunk was completely melted and formed a column on the center of the crucible without contacting the inner wall of the crucible.

Here, it should be noted that the temperature of the silicon melt is higher than that of the graphite crucible. This phenomenon cannot be observed by an indirect heating manner of the conventional graphite crucible, and proves that the temperature of the silicon melt was increased due to direct heating by the intensive electromagnetic force invading the silicon melt in the crucible.

Comparative Example

A graphite crucible of Comparative Example had the same size as Examples 1 and 2, but was not formed with slits. In silicon melting with the graphite crucible of Comparative Example, melting behavior was observed while measuring a slit temperature, a bottom temperature and a silicon temperature according to power applied to an induction coil wound around the crucible. As the applied power was increased, the temperature of the graphite crucible was increased and there was substantially no temperature difference between the outer wall and the bottom of the crucible.

As the silicon chunk started melting, a silicon melt was moved downward and finally contacted an inner wall of the crucible. This is because most of the magnetic field created from the induction coil was absorbed by graphite and failed to effectively invade the silicon melt.

Table 1 shows a ratio of crucible heating value and a ratio of silicon heating value when melting silicon through electromagnetic induction with the conventional graphite crucible having no slit (Comparative Example), the graphite crucible having 12 slits (Example 1), and the graphite crucible having 24 slits (Example 2).

TABLE 1

| Number of slits | Ratio of heating value by crucible direct induction (%) | Ratio of heating value by silicon indirect induction (%) |
|---|---|---|
| 0 | 92.13 | 7.87 |
| 12 | 64.15 | 35.85 |
| 24 | 53.84 | 46.16 |

In the conventional graphite crucible having no slit (Comparative Example), about 92% of a total heating value was provided by direct induction of graphite. On the other hand, in the graphite crucibles of the inventive examples having plural slits, a ratio of heating value by silicon indirect induction was comparatively high. Specifically, in the graphite crucible having 12 slits (Example 1), about 36% of a total heating value was provided by indirect induction of silicon, and, in the graphite crucible having 24 slits (Example 2), about 46% of a total heating value was provided by indirect induction of silicon.

Therefore, it can be understood from Table 1 that the plural slits in the graphite crucible improve indirect melting efficiency as in the examples.

Table 2 lists amounts of metallic impurities in silicon when melting and refining a silicon raw material containing metallic impurities in the graphite crucible of Example 2.

TABLE 2

| | | Impurity element | | | | | | |
|---|---|---|---|---|---|---|---|---|
| | | Al | Fe | Ca | Ti | Mn | Cr | Mg | Zr |
| | Input amount | 446.4 | 831.1 | 148.8 | 85.9 | 158.5 | 30.3 | <10 | <10 |
| Example 2 | Center | 17.8 | 5.19 | 49.7 | <10 | <10 | <10 | <10 | <10 |
| | Upper surface | 32.9 | 50.9 | 17.8 | <10 | <10 | <10 | <10 | <10 |

In Table 2, it can be seen that the amounts (unit: ppm) of metallic impurities, such as Al, Fe, Ca, Ti, Mn, and the like were rapidly decreased in the center and on the upper surface of the crucible after induction melting, compared with the input amount of the impurities.

According to this result, it can be understood that during contact-free silicon melting, an agitation phenomenon was created by electromagnetic induction and caused movement of the impurities towards the surface of the silicon melt to allow vacuum volatile refining thereon. Further, since the silicon melt underwent induction melting without contacting the inner wall of the crucible, the silicon melt has an increased surface area, which improves refining efficiency.

Next, a process of melting silicon in the graphite crucible 300 according to the embodiment will be described.

When an electric current is applied to the induction coil 301 wound around the outer wall 321 of the graphite crucible, the crucible undergoes induction heating. Then, a silicon raw material charged into the crucible is indirectly melted on the bottom of the crucible by heat from the induction-heated crucible, and forms a silicon melt of about 1,400~1,500° C. after a predetermined duration.

Figure 9:
FIG. 9 is a picture of solid silicon obtained using the graphite crucible according to the embodiment of the present invention.

Since silicon exhibits as high electric conductivity as metals at or above the melting point thereof, a silicon melt formed by indirect melting moves upward during induction melting, whereby agitation of the silicon melt occurs. Further, the silicon melt is subjected to direct electromagnetic induction melting without contacting the inner wall 322 of the crucible by the electromagnetic force acting toward the inner center of the crucible. The completely molten silicon does not contact the inner wall 322 of the crucible, and continuous agitation occurs in the silicon melt to force the impurities to move to the surface of the silicon melt. As a result, highly pure silicon can be obtained as shown in FIG. 9.

Since the silicon melt can contact the bottom surface 323 of the crucible, there is a need for preventing the silicon melt from contacting graphite in the inner bottom surface 323 of the crucible. For this purpose, the bottom surface 323 of the crucible may be coated with silicon carbide (SiC) or silicon nitride ($Si_3N_4$). Alternatively, a dummy bar formed of silicon carbide (SiC) or silicon nitride ($Si_3N_4$) may be placed in advance on the inner bottom surface 323 of the crucible before the silicon raw material is charged into the crucible.

Silicon melting is performed by electromagnetic induction melting, and more particularly by a combination of indirect melting and direct melting as follows.

A silicon raw material charged into the crucible through the open upper part of the crucible is indirectly melted to form a silicon melt by heat from the crucible, which is subjected to induction heating by an electric current flowing in the induction coil 301. Then, the silicon melt is subjected to induction melting without contacting the inner wall 322 of the crucible by the electromagnetic force which is created by the current flowing in the induction coil 301 and acts toward the inner center of the crucible.

Here, since the formation of the silicon melt from the silicon raw material is achieved by heat from the graphite crucible, it can be referred to as indirect melting, and induction melting of the silicon melt without contacting the inner wall 322 of the crucible can be referred to as direct melting.

An apparatus for melting and refining silicon according to an embodiment of the present invention employs a graphite crucible according to an embodiment of the present invention. Therefore, the apparatus can be fabricated at low costs and prevent contamination of silicon and the crucible by achieving contact-free melting. Further, since indirect melting is performed by heat from the graphite crucible at an initial melting stage, there is no need for an additional heat source. Furthermore, since the crucible is formed of a graphite material, there is no problem of heat loss.

Although some embodiments have been provided to illustrate the present invention, it will be apparent to a person skilled in the art that various modifications or changes can be made without departing from the spirit and scope of the present invention. Therefore, the scope of the present invention should be limited only by the following claims.

That which is claimed is:

1. A graphite crucible for electromagnetic induction-based silicon melting, the crucible being formed of a graphite material and comprising a cylindrical body having an open upper part through which a silicon raw material is chargeable into the crucible, wherein an entirety of the cylindrical body comprises the graphite material, and an outer wall surround by an induction coil, wherein a plurality of slits are vertically formed through the outer wall and an inner wall of the crucible, the induction coil and the plurality of slits are configured to generate an electromagnetic force toward an inner center of the crucible to prevent a silicon melt from contacting the inner wall of the crucible, and to maintain a temperature at a bottom surface of the cylindrical body higher than a temperature at each slit of the plurality of slits.

2. The graphite crucible according to claim 1, wherein each of the plurality of slits is formed from the upper part of the crucible to an inner bottom surface thereof and separated at constant intervals from each other.

3. The graphite crucible according to claim 1, wherein the plurality of slits comprises at least 12 slits.

4. The graphite crucible according to claim 3, wherein the plurality of slits comprises at least 24 slits, and the crucible has an inner diameter of 50 mm or more.

5. The graphite crucible according to claim 1, wherein each of the plurality of slits has a width of 0.3-1.5 mm.

6. The graphite crucible according to claim 1, wherein an inner bottom surface of the crucible is coated with at least one of SIC and Si3N4.

7. The graphite crucible according to claim 1, wherein the induction coil is configured to indirectly melt the silicon raw material to form the silicon melt.

8. An apparatus for melting and refining silicon with a graphite crucible for electromagnetic induction based silicon melting, the apparatus comprising:
   a cylindrical crucible formed of a graphite material, the crucible having an open upper part and a bottom part and a plurality of slits vertically formed through inner and outer walls of the crucible; and
   an induction coil surrounding the outer wall of the crucible,
   wherein the cylindrical crucible is configured to receive a silicon raw material charged into the crucible through the upper part of the crucible, and contain a silicon melt, and the induction coil and the plurality of slits are configured to prevent the silicon melt from contacting the inner wall of the crucible by an electromagnetic force created by an electric current flowing in the induction coil and acting toward an inner center of the crucible, and to maintain a temperature at a bottom surface of the cylindrical body higher than a temperature at each slit of the plurality of slits.

9. The apparatus according to claim 8, wherein each of the plurality of slits is formed from the upper part of the crucible to an inner bottom surface thereof and separated at constant intervals from each other.

10. The apparatus according to claim 8, wherein the plurality of slits comprises at least 12 slits.

11. The apparatus according to claim 10, wherein the plurality of slits comprises at least 24 slits, and the crucible has an inner diameter of 50 mm or more.

12. The apparatus according to claim 8, wherein each of the slits has a width of 0.3-1.5 mm.

13. The apparatus according to claim 8, wherein an inner bottom surface of the crucible is coated with at least one of SIC and $Si_3N_4$.

14. The apparatus according to claim 8, wherein the induction coil is configured to indirectly melt the silicon raw material to form the silicon melt.

* * * * *